(12) United States Patent
Liu et al.

(10) Patent No.: US 12,009,223 B2
(45) Date of Patent: Jun. 11, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Zhongming Liu, Hefei (CN); Jia Fang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 376 days.

(21) Appl. No.: 17/445,391

(22) Filed: Aug. 18, 2021

(65) Prior Publication Data
US 2022/0020600 A1 Jan. 20, 2022

Related U.S. Application Data

(63) Continuation of application No. PCT/CN2021/099943, filed on Jun. 15, 2021.

(30) Foreign Application Priority Data

Jul. 16, 2020 (CN) .......................... 202010685015.1

(51) Int. Cl.
*H01L 21/3213* (2006.01)
*H01L 21/308* (2006.01)
(Continued)

(52) U.S. Cl.
CPC ...... *H01L 21/32135* (2013.01); *H01L 21/308* (2013.01); *H01L 21/76838* (2013.01); *H01L 23/528* (2013.01)

(58) Field of Classification Search
CPC ............. H01L 23/5283; H01L 23/5226; H01L 21/76885; H01L 21/76879; H01L 21/76883
See application file for complete search history.

(56) References Cited

U.S. PATENT DOCUMENTS 4,380,489 A * 4/1983 Beinvogl ............ C04B 41/5346
438/719
8,319,264 B2 * 11/2012 Kim ...................... H10B 12/485
438/533
(Continued)

FOREIGN PATENT DOCUMENTS

CN 105206520 A 12/2015
CN 108257958 A 7/2018
(Continued)

*Primary Examiner* — Jarrett J Stark
(74) *Attorney, Agent, or Firm* — Syncoda LLC; Feng Ma

(57) ABSTRACT

A method for manufacturing a semiconductor structure includes: a substrate with a groove structure formed therein is provided; a laminated structure is formed on the substrate, which includes a first conductive material layer, a second conductive material layer and an insulating material layer from bottom up, and the first conductive material layer fills the groove structure and covers the surface of the substrate; the insulating material layer, the second conductive material layer and the first conductive material layer are sequentially etched to form a bit line structure, in which a process of etching the first conductive material layer includes a first etching stage and a second etching stage, such that a bottom width of the first pattern structure located in the groove structure is not smaller than that of the first pattern structure located outside the groove structure.

12 Claims, 10 Drawing Sheets

(51) Int. Cl.
*H01L 21/768* (2006.01)
*H01L 23/528* (2006.01)

(56) References Cited

U.S. PATENT DOCUMENTS

| | | | |
|---|---|---|---|
| 9,082,827 B2* | 7/2015 | Yu | ............... H10B 12/00 |
| 9,159,730 B2* | 10/2015 | Kim | ............... H10B 12/482 |
| 9,607,994 B2* | 3/2017 | Kim | ............... H01L 21/76897 |
| 10,559,570 B2 | 2/2020 | Nagai | |
| 10,854,676 B2 | 12/2020 | Feng et al. | |
| 11,699,617 B2* | 7/2023 | Huang | ............... H01L 21/76877 |
| | | | 257/532 |
| 11,723,191 B2* | 8/2023 | Choi | ............... H10B 12/0335 |
| | | | 257/296 |
| 2009/0163028 A1* | 6/2009 | Jung | ............... H01L 21/76802 |
| | | | 257/E21.249 |
| 2017/0154805 A1* | 6/2017 | Kim | ............... H01L 23/5226 |
| 2017/0301569 A1* | 10/2017 | Lee | ............... H01L 21/31144 |
| 2018/0190662 A1* | 7/2018 | Wu | ............... H01L 21/32139 |
| 2018/0211964 A1 | 7/2018 | Feng et al. | |
| 2019/0067294 A1* | 2/2019 | Lee | ............... H10B 12/315 |
| 2019/0221569 A1* | 7/2019 | Nagai | ............... H10B 12/315 |

FOREIGN PATENT DOCUMENTS

| | | | | |
|---|---|---|---|---|
| CN | 108346660 A | | 7/2018 | |
| CN | 110061000 A | | 7/2019 | |
| CN | 110085551 A | | 8/2019 | |
| CN | 110690193 A | * | 1/2020 | ....... H01L 21/76879 |
| CN | 110690193 A | | 1/2020 | |

* cited by examiner

SEMICONDUCTOR STRUCTURE AND MANUFACTURING METHOD THEREOF

CROSS-REFERENCE TO RELATED APPLICATIONS

The present application is a continuation of International Application No. PCT/CN2021/099943 filed on Jun. 15, 2021, which claims priority to Chinese Patent Application No. 202010685015.1 filed on Jul. 16, 2020. The disclosures of these applications are hereby incorporated by reference in their entirety.

BACKGROUND

In semiconductor structures, a bit line structure is a laminated structure including a cover layer (insulating layer), a conductive metal layer and a non-metal conductive layer which are laminated from top to bottom, wherein the conductive metal layer and the non-metal conductive layer form a bit line of the bit line structure. In order to improve the electric leakage phenomenon between bit lines, the width of the bit line in a bit line contact hole in the current semiconductor structure is small, but the reduction of the width causes the bit line contact resistance to increase. In addition, the bit line has a large width on the surface of the substrate, which occupies part of the node contact window space, resulting in an increase in the node contact resistance between the node contact window and an active region, thereby affecting the quality of the semiconductor structure.

SUMMARY

The disclosure relates generally to the technical field of semiconductor manufacturing processes, and more specifically to a semiconductor structure and a method for manufacturing the semiconductor structure.

According to various embodiments of the disclosure, a semiconductor structure and a method for manufacturing the semiconductor structure are provided.

The embodiment of the disclosure provides a method for manufacturing a semiconductor structure. The manufacturing method includes the following operations.

A substrate is provided, in which a groove structure is formed.

A laminated structure is formed on the substrate, in which the laminated structure includes a first conductive material layer, a second conductive material layer and an insulating material layer from bottom up, and the first conductive material layer fills the groove structure and covers the surface of the substrate.

The insulating material layer, the second conductive material layer and the first conductive material layer are sequentially etched to form an insulating layer, a second conductive layer and a first conductive layer, respectively. The insulating layer, the second conductive layer and the first conductive layer jointly form a first pattern structure. The process of etching the first conductive material layer includes a first etching stage and a second etching stage. In the first etching stage, a first etching gas is used for etching the first conductive material layer until the upper surface of the substrate is exposed, and in the second etching stage, a second etching gas is used for etching the first conductive material layer.

A bottom width of the first pattern structure located in the groove structure is not smaller than that of the first pattern structure located outside the groove structure.

The embodiment of the disclosure further provides a semiconductor structure.

The semiconductor structure includes a substrate and a first pattern structure.

A groove structure is formed in the substrate.

The first pattern structure includes a first conductive layer, a second conductive layer and an insulating layer which are laminated from bottom up, the first pattern structure is located on the surface of the substrate and the bottom of the groove structure, and a bottom width of the first pattern structure located in the groove structure is not smaller than that of the first pattern structure located outside the groove structure.

BRIEF DESCRIPTION OF THE DRAWINGS

In order to describe the technical solutions in the embodiments of the disclosure or the relevant art more clearly, the drawings required to be used in descriptions about the embodiments or the relevant art will be simply introduced below, it is apparent that the drawings described below are only some embodiments of the disclosure, and other drawings may further be obtained by those skill in the art according to the drawings without creative work.

Figure 1:
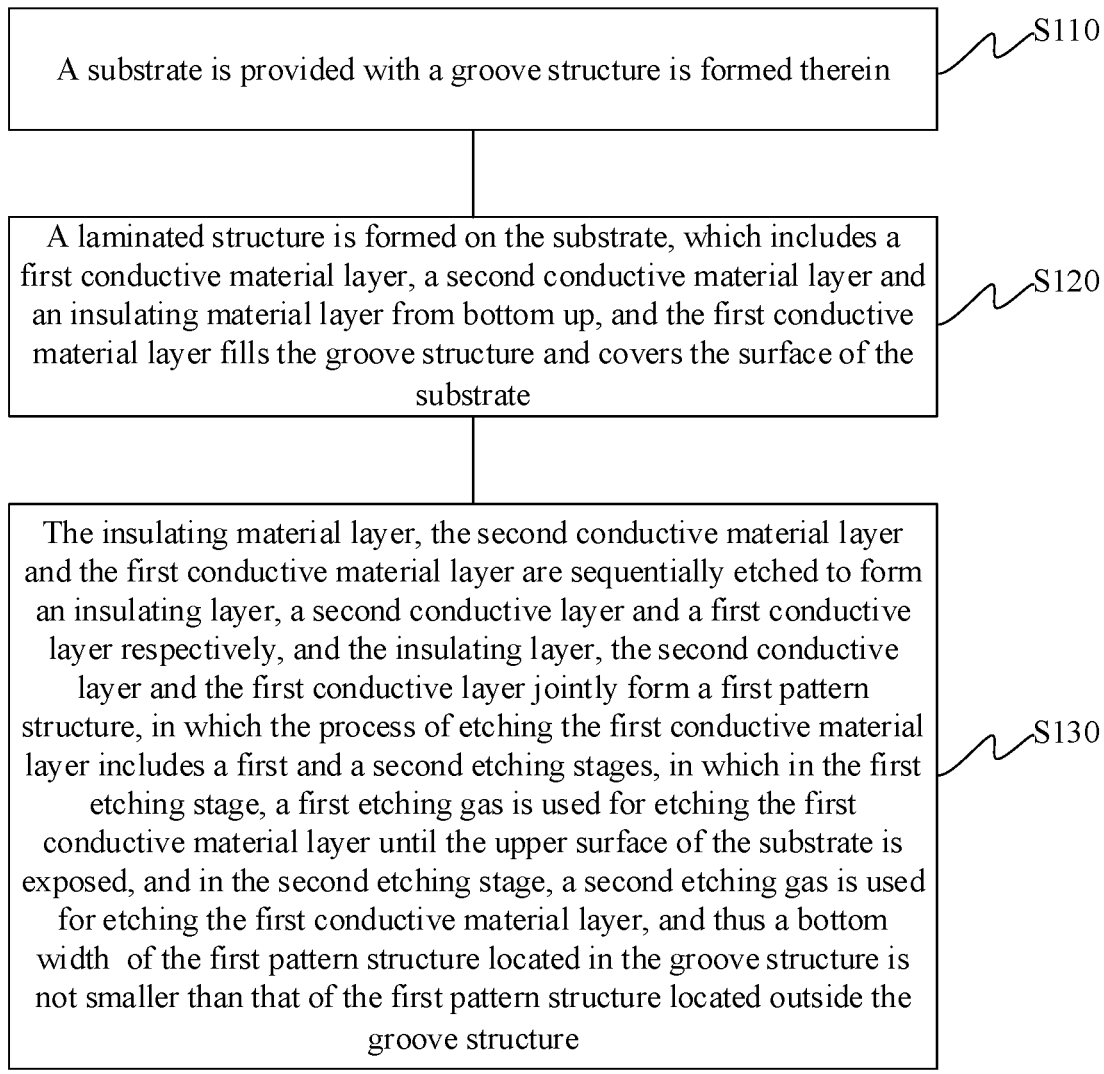
FIG. 1 illustrates a flowchart of a manufacturing method of a semiconductor structure according to some embodiments of the disclosure.

REFERENCE NUMERALS substrate: 100, groove structure: 200, first conductive layer: 310, second conductive layer: 320, insulating layer: 330, first conductive material layer: 310*a*, second conductive material layer: 320*a*, insulating material layer: 330*a*, metal barrier material layer: 321, metal material layer: 322, dielectric layer: 400, second hard mask layer: 500, second hard mask material layer: 510, second organic mask material layer: 520, oxide layer: 700, first pattern structure: 300.

DETAILED DESCRIPTION

In order to make the purposes, features and advantages of the disclosure become more apparent and easier to understand, the specific implementation modes of the disclosure will be described in detail below in combination with the drawings. Numerous specific details are set forth in the following description to provide a thorough understanding of the disclosure. However, the disclosure can be implemented in many other ways than those described herein, and those skilled in the art may make similar modifications without departing from the contents of the disclosure, and therefore the disclosure is not limited by the specific implementations disclosed below.

Referring to FIG. 1, the embodiment of the disclosure provides a manufacturing method of a semiconductor structure. The manufacturing method includes the following operations.

In S110, a substrate 100 is provided, and a groove structure 200 is formed in the substrate 100.

In S120, a laminated structure is formed on the substrate 100, the laminated structure includes a first conductive material layer 310a, a second conductive material layer 320a and an insulating material layer 330a from bottom up, and the first conductive material layer 320a fills the groove structure 200 and covers the surface of the substrate 100.

In S130, the insulating material layer 330a, the second conductive material layer 320a and the first conductive material layer 310a are sequentially etched to form an insulating layer 330, a second conductive layer 320 and a first conductive layer 310 respectively, the insulating layer 330, the second conductive layer 320 and the first conductive layer 310 jointly form a first pattern structure 300, the process of etching the first conductive material layer 310a includes a first etching stage and a second etching stage, in the first etching stage, first etching gas is used for etching the first conductive material layer 310a until the upper surface of the substrate 100 is exposed, and in the second etching stage, second etching gas is used for etching the first conductive material layer 310a.

The width of the bottom of the first pattern structure 300 located in the groove structure 200 is not smaller than the width of bottom of the first pattern structure 300 located outside the groove structure 200.

In the embodiment, the first conductive material layer 310a fills the groove structure 200 and covers the surface of the substrate 100, and in the process of forming the first pattern structure 300 through etching, the process of etching the first conductive material layer 310a includes the first etching stage and the second etching stage. In the first etching stage, the first etching gas is used for etching the first conductive material layer 310 until the upper surface of the substrate 100 is exposed, in the second etching stage, the second etching gas is used for etching the first conductive material layer 310a, such that the first pattern structure is formed, meanwhile, the width of the first conductive material layer 310a located in the groove structure 200 is not smaller than the width of the first conductive material layer 310a located outside the groove structure 200, therefore, the contact area of the first pattern structure 300 and the substrate is increased, the contact resistance between the first pattern structure 300 and the substrate is reduced, and the quality of the semiconductor structure is improved.

In the embodiment, the substrate 100 includes, but is not limited to, a silicon base, an epitaxial silicon base, a silicon germanium base, a silicon carbide base, or a silicon-coated insulating base. The type of substrate 100 can be selected by the skilled in the art according to the semiconductor structure formed on the substrate 100, and therefore, the type of substrate 100 should not limit the scope of the disclosure. In the embodiment, the substrate 100 is a P-type crystalline silicon substrate.

The substrate 100 includes a base and a shallow groove structure formed in the base, a plurality of active regions arranged in parallel in a staggered mode are defined through the shallow groove structure, and the shallow groove structure is filled with an insulating material to form a shallow groove isolation structure. The substrate 100 further includes a word line structure, the word line structure is an embedded word line structure, and the extension direction of the embedded word line structure intersects with the extension direction of the first pattern structure 300. In addition, the word line structure can be formed on the surface of the substrate.

In one of the embodiments, in the first pattern structure 300, the width of the bottom of the first pattern structure 300 located in the groove structure 200 is greater than the width of the first pattern structure 300 located outside the groove structure 200.

In the embodiment, the width of the bottom of the first pattern structure 300 located in the groove structure 200, namely, the width of the bottom of the first conductive material layer 310a located in the groove structure 200 is d1, the width of the first pattern structure located outside the groove structure 200 is d2, and d1 is greater than d2. When the width d1 is larger, the contact area between the first pattern structure 300 and the active regions in the substrate is increased, the contact resistance between the first pattern structure 300 and the substrate is reduced accordingly, and meanwhile, the risk that the first pattern structure 300 collapses can be reduced. In addition, by narrowing the width of the first conductive material layer 310a outside the groove structure 200, the size of the first pattern structure 300 outside the groove structure 200 can be reduced. For example, when the first pattern structure 300 is a laminated bit line structure, by narrowing the width of the first conductive material layer 310a outside the groove structure 200, the contact area of a node contact window and a active region can be increased, therefore contact resistance of a node is reduced, and the product quality is improved.

In one of the embodiments, the step of forming a groove structure 200 in a substrate 100 includes the following operations.

A dielectric layer 400 is formed on the surface of the substrate 100.

A second hard mask layer 500 is formed on the surface of the dielectric layer 400, a second target pattern is arranged in the second hard mask layer 500, and the groove structure 200 is defined by the second target pattern.

Using the second hard mask layer 500 as a mask, the dielectric layer 400 and the substrate 100 are etched to form the groove structure 200.

In the embodiment, when the semiconductor structure is a memory device and the first pattern structure is a bit line structure, after the word line structure is formed, the step of forming the groove structure 200 on the surface of the substrate 100 includes the following main operations.

Figure 2:
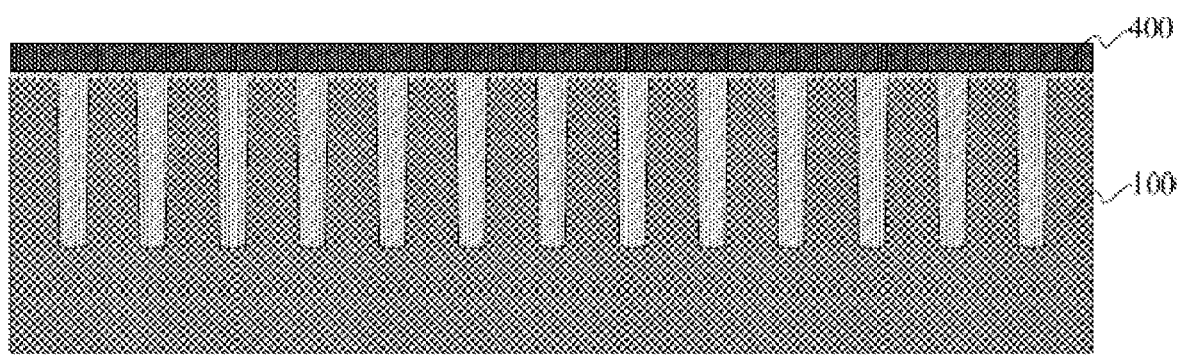
FIG. 2 is a first schematic structural diagram of a semiconductor structure after an etching step according to some embodiments of the disclosure.

First, a dielectric material is deposited on the surface of the substrate 100 by a deposition process to form the dielectric layer 400, and the dielectric layer 400 covers the surface of the substrate 100. The dielectric material can include any dielectric material such as silicon oxide, silicon oxynitride, amorphous silicon, amorphous carbon, or any combination thereof. Referring to FIG. 2. The deposition process can include chemical vapor deposition (CVD), low pressure CVD (LPCVD), plasma enhanced CVD (PECVD), atomic layer deposition (ALD), and plasma enhanced ALD (PEALD). In the embodiment, the dielectric layer 400 is formed through the CVD technique.

Figure 3:
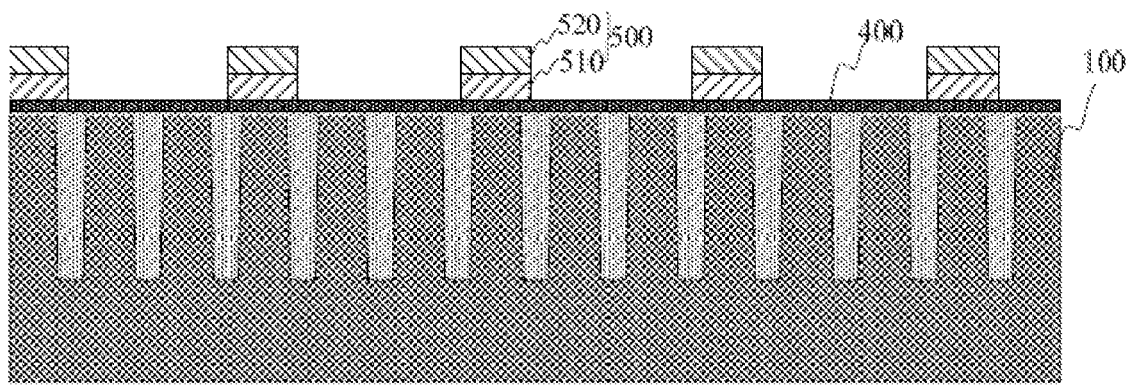
FIG. 3 is a second schematic structural diagram of a semiconductor structure after an etching step according to some embodiments of the disclosure.

Then a second hard mask material layer 510 and a second organic mask material layer 520 are sequentially formed on the surface of the dielectric layer 400, the second hard mask material layer 510 is formed by utilizing an insulating material such as silicon oxide, and the second organic mask material layer 520 is formed by utilizing a silicon-containing organic material. Then, a layer of photoresist is applied to the second organic mask material layer 520 to form a first photoresist layer (not shown), and patterning is carried out on the first photoresist layer through a photolithography process. The patterned first photoresist layer has the second target pattern defining the groove structure 200 (i.e., a bit line contact hole). The second organic mask material layer 520 and the second hard mask material layer 510 are etched using the patterned first photoresist layer as a mask, thus the second target pattern is transferred to the second organic mask material layer 520 and the second hard mask material layer 510. The second hard mask layer 500 is constituted by the reserved second organic mask material layer 520 and second hard mask material layer 510. The first photoresist layer is removed. Reference is made to FIG. 3.

Figure 4:
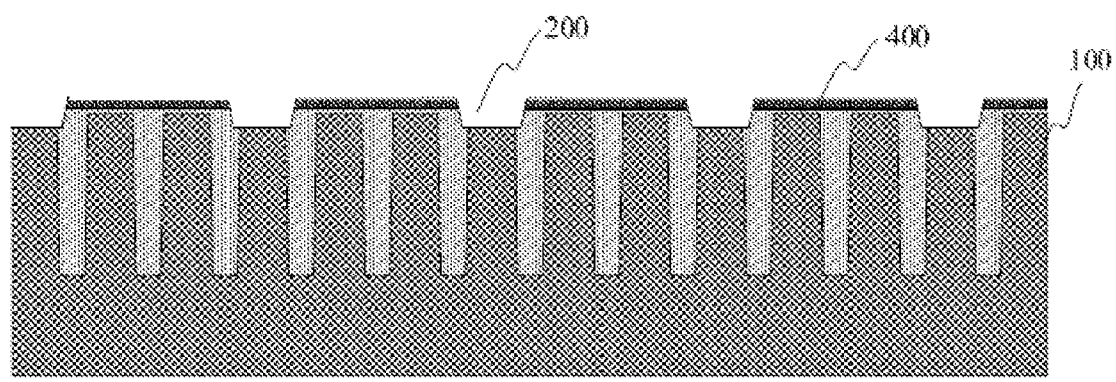
FIG. 4 is a third schematic structural diagram of a semiconductor structure after an etching step according to some embodiments of the disclosure.

Finally, referring to FIG. 4, using the second hard mask layer 500 as a mask, the dielectric layer 400 and the substrate 100 are etched using a dry etching process to form the groove structure 200, and the second hard mask layer 500 is removed.

Figure 5:
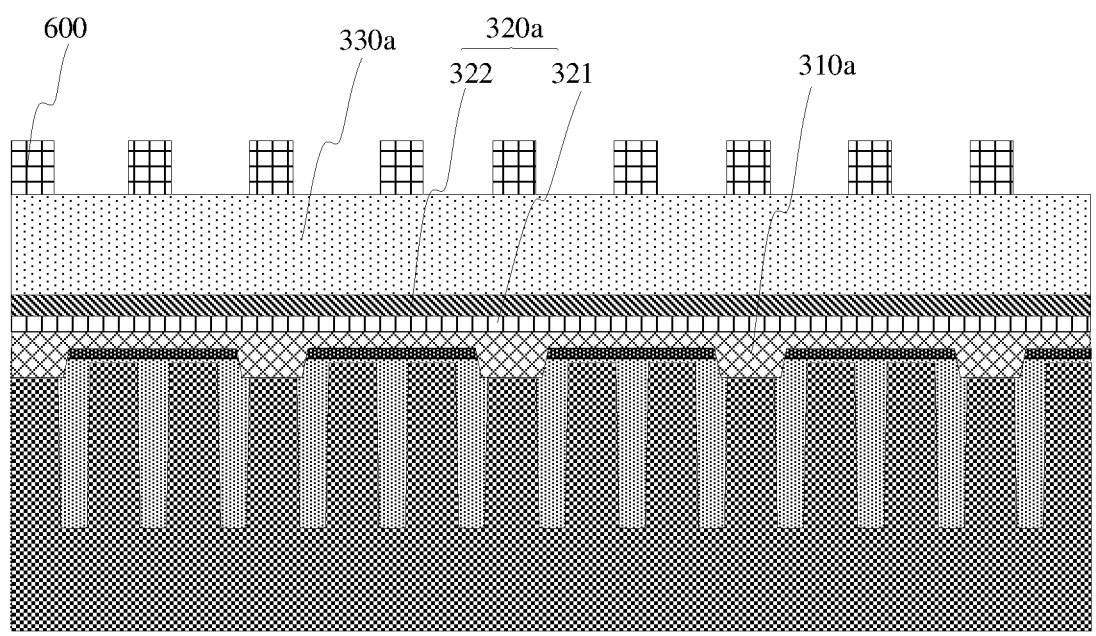
FIG. 5 is a fourth schematic structural diagram of a semiconductor structure after an etching step according to some embodiments of the disclosure.

Referring to FIG. 5, In one of the embodiments, the step of forming a laminated structure on the substrate 100 mainly includes the following operations.

A non-metal conductive material, such as polysilicon, amorphous silicon, or other non-metal conductive materials with or without silicon, is formed on the substrate 100 formed with the groove structure 200 to form the first conductive material layer 310*a*, and the first conductive material layer 310*a* fills the groove structure 200 and covers the surface of the substrate 100. In the embodiment, the first conductive material layer 310*a* is manufactured by the polysilicon material, and thus the first conductive material layer 310*a* includes a polysilicon material layer.

A metal material is deposited on the surface of the first conductive material layer 310*a* to form the second conductive material layer 320*a*.

The insulating material layer 330*a* is formed by depositing silicon nitride, silicon oxynitride, silicon carbonitride, or other suitable insulating materials, and the insulating material layer 330*a* covers the surface of the second conductive material layer 320*a*. In addition, to reduce the probability of leakage between a bit line and a capacitive contact line, the thickness of the insulating material layer 330*a* is generally increased, and thus the thickness of the insulating material layer 330*a* in the embodiment is much greater than the thickness of the second conductive material layer 320*a* and/or the first conductive material layer 310*a*.

With continued reference to FIG. 5, when the first conductive material layer adopts the polysilicon material and the second conductive layer adopts a metal material, in order to avoid diffusion of metal atoms to the polysilicon material layer, the second conductive layer is generally configured as a composite structure including a metal barrier material layer and a metal material layer. The process for forming the second conductive material layer 320*a* mainly includes the following operations.

A metal barrier material layer 321 covering the upper surface of the polysilicon material layer is formed.

A metal material layer 322 covering the upper surface of the metal barrier material layer 321 is formed.

In the embodiment, the second conductive material layer 320*a* has a laminated structure, and includes the metal barrier material layer 321 and the metal material layer 322 arranged in sequence from bottom up. The metal barrier material layer 321 and the metal material layer 322 can be formed by laminating tungsten and any one or any combination of titanium nitride, titanium, tungsten silicide, tungsten nitride, in which the metal barrier material layer 321 is formed by using one or any combination of titanium nitride, titanium, tungsten silicide, tungsten nitride, and tungsten silicon nitride. In addition, the second conductive material layer 320*a* can also be formed by selecting other metals, metal nitrides, metal silicides, and metal silicon nitrides.

After the laminated structure is formed, the first pattern structure 300 is formed by etching the laminated structure. In one of the embodiments, the operation that an insulating material layer 330*a*, a second conductive material layer 320*a* and a first conductive material layer 310*a* are sequentially etched to form an insulating layer 330, a second conductive layer 320 and a first conductive layer 310 respectively, and the insulating layer 330, the second conductive layer 320 and the first conductive layer 310 jointly form a first pattern structure 300. The process includes the flowing operations.

A first hard mask layer 600 is formed on the upper surface of the insulating material layer, a first target pattern is arranged in the first hard mask layer 600, and the first pattern structure 300 is defined by the first target pattern.

Using the first hard mask layer 600 as a mask, the insulating material layer 330*a* is etched until the second conductive material layer 320*a* is exposed, and the first target pattern is transferred to the insulating material layer 330*a* to form the insulating layer 330.

The first hard mask layer 600 is removed.

Using the insulating layer 330 as a mask, the second conductive material layer 320*a* is etched until the first conductive material layer 310*a* is exposed, and the first target pattern is transferred to the second conductive material layer 320*a* to form the second conductive layer 320.

Using the insulating layer 330 as a mask, the first conductive material layer 310*a* is etched in stages, the upper surface of the substrate 100 is exposed to form the first pattern structure 300 after the first etching stage is finished, and the first pattern structure 300 is formed in the groove structure 200 after the second etching stage is finished.

Specifically, in the embodiment, the process of forming the first pattern structure 300 by etching the laminated structure includes the following operations.

1) A first hard mask layer 600 is formed. In the embodiment, the first hard mask layer 600 is formed through a self-aligned dual imaging technology. The step mainly includes the following operations. First, an amorphous carbon material, a silicon oxynitride material and an oxide material are sequentially deposited on the surface of the insulating material layer 330*a* to form a first organic mask material layer; a first hard mask material layer and a sacrificial material layer, a layer of photoresist is applied to the sacrificial material layer to form a first photoresist layer, the pattern on the corresponding mask plate is transferred to the first photoresist layer by utilizing a photoetching process, the sacrificial material layer is etched using the first photoresist layer as a mask; and the first photoresist layer is removed after etching. Next, a hard mask material is deposited on the surface of the sacrificial material layer by using an atomic layer deposition process to form a third hard mask material layer; back etching is carried out on the third hard mask material layer, and the third hard mask material layer positioned on the side wall of the sacrificial material layer is reserved as the first target pattern to define the first pattern structure 300. Then, the first target pattern is transferred to the first hard mask material layer and the first organic mask material layer in sequence. Finally, the third hard mask material layer is removed to form the first hard mask layer 600 including the first hard mask material layer and the first organic mask material layer.

2) The insulating material layer 330a is etched. Specifically, using the first hard mask layer 600 as a mask, the insulating material layer 330a is etched by using an etching gas including one or more of octafluorocyclobutane, octafluorocyclopentene and hexafluorobutadiene until the second conductive material layer 320a is exposed, and the first target pattern is transferred to the insulating material layer 330a. In the embodiment, the insulating material layer 330a is etched by using the etching gas containing octafluorocyclobutane, octafluorocyclopentene and hexafluorobutadiene, therefore the insulating layer 300 is formed.

3) In order to eliminate the limitation of depth on the etching process in the etching process, the first hard mask layer 600 is removed after etching of the insulating material layer 330a is completed, which, in addition, can preventing collapse caused by the excessively high laminated structure.

Figure 6:
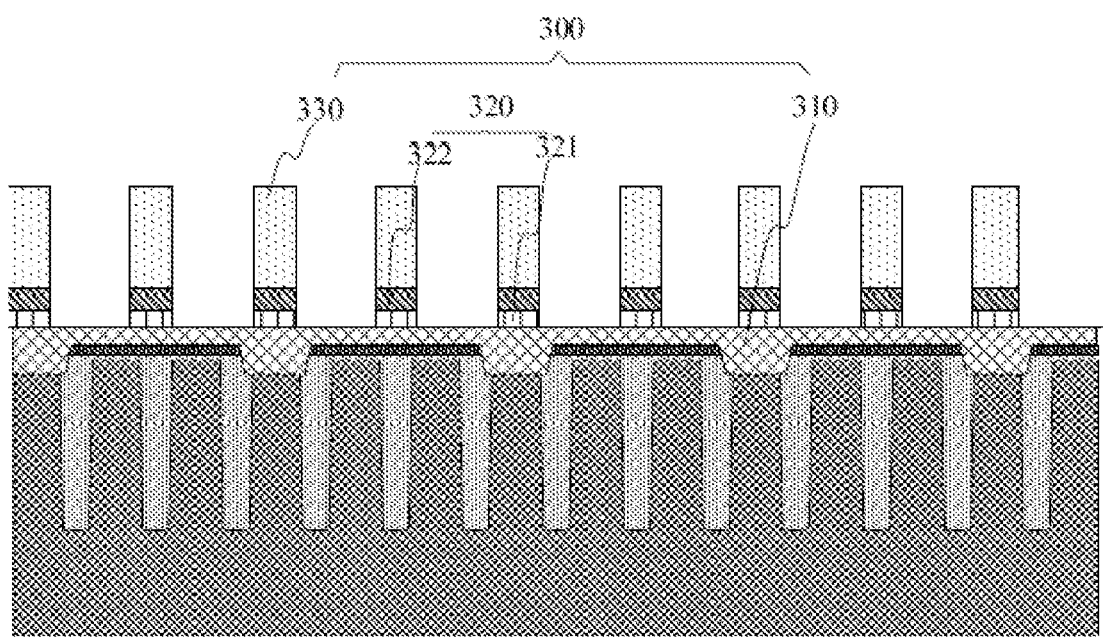
FIG. 6 is a fifth schematic structural diagram of a semiconductor structure after an etching step according to some embodiments of the disclosure.

4) Using the insulating layer 330 as a mask, the second conductive material layer 320a is etched by using the etching gas containing sulfur hexafluoride until the first conductive material layer 310a is exposed, the first target pattern is transferred to the second conductive material layer 320a, and the reserved second conductive material layer 320a serves as the second conductive layer. The flow rate of each gas in the etching gas containing sulfur hexafluoride can be set according to actual needs, referring to FIG. 6.

Figure 7:
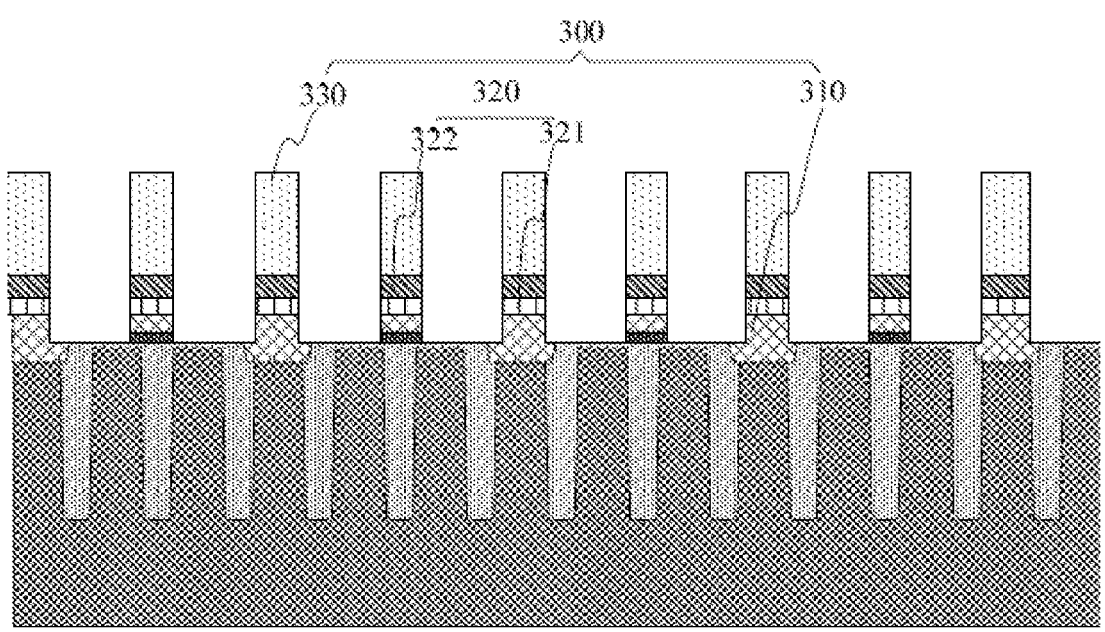
FIG. 7 is a sixth schematic structural diagram of a semiconductor structure after an etching step according to some embodiments of the disclosure.

5) Using the insulating material layer 330a as a mask, the first conductive material layer 310a is etched in stages, the upper surface of the substrate 100 is exposed to form the first pattern structure 300 after the first etching stage is finished, referring to FIG. 7; and the first pattern structure 300 is formed in the groove structure 200 after the second etching stage is finished.

To shorten the process cycle, in one of the embodiments, the etching ability of the first etching gas is stronger than the etching ability of the second etching gas. In the first etching stage, the first etching gas with strong etching ability is used for etching the first conductive material layer until the upper surface of the substrate is exposed, such that the etching speed is improved, and the manufacturing process is shortened.

In one of the embodiments, the first etching gas used in the first etching stage includes chlorine, nitrogen, argon and helium. The flow rate of chlorine ranges from about 80 SCCM to about 120 SCCM. The flow rate of nitrogen ranges from about 60 SCCM to about 80 SCCM. The flow rate of argon ranges from about 40 SCCM to about 60 SCCM. The flow rate of helium ranges from about 300 SCCM to about 500 SCCM. Specifically, the flow rate of chlorine is 90, 100 or 100 SCCM. The flow rate of nitrogen is 60, 70 or 80 SCCM. The flow rate of argon is 40, 50 or 60 SCCM. The flow rate of helium is 350, 400, 450 or 500 SCCM. The duration of the first etching stage is about 15 s. It can be understood, chlorine has relatively strong etching ability, such that the etching speed can be accelerated and the etching time can be shortened by utilizing chlorine for etching in the first etching stage. In addition, as chlorine is easy to diffuse due to its small molecule, the ratio of the longitudinal etching rate to the transverse etching rate can be increased, which guarantees that the first conductive material layer 310 located on the upper surface of the substrate keeps a good vertical condition, and the first conductive material layer 310 does not occupy the space of the upper surface of the active regions. For example, when the first pattern structure is a bit line structure, the contact area between the node contact window and the active regions can be increased, and the contact resistance of the node is reduced.

In one of the embodiments, the duration of the first etching stage is about 12-18 s. In the embodiment, the first etching stage is controlled within about 12-18 s, such that the phenomenon that the first pattern structure may not be formed on the surface of the substrate due to too short etching time can be prevented, meanwhile, the problem of excessive etching due to too long etching time can also be prevented.

In one of the embodiments, oxygen is introduced during the second etching stage. In the embodiment, in the second etching stage, oxygen is introduced to oxidize the surface of the first conductive material layer, such that an oxide layer is formed on the surface of the first conductive material layer. The oxidation rate of the first conductive material in a multi-groove structure is smaller than that of the first conductive material outside the groove structure, such that the thickness of the oxide layer on the surface of the first conductive material layer in the groove structure is smaller than that of the oxide layer on the surface of the first conductive material layer outside the groove structure, therefore, after the oxide layer is removed, the width of the bottom of the first conductive material layer is greater than that of the top of the first conductive material layer, and the contact area of the first conductive material layer and the active regions in the substrate is increased.

In the second etching phase, various specific ways for treating the first conductive material layer using etching and oxidation processes are available, in one of the embodiments, the step of etching the first conductive material layer 310a in the second etching stage includes the following operations.

Figure 8:
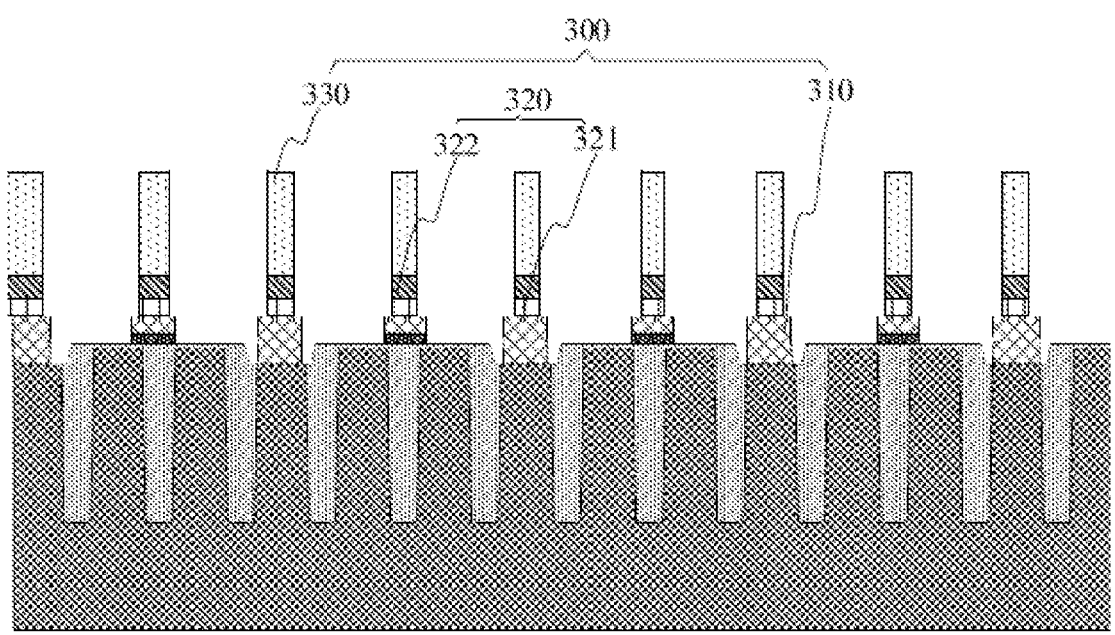
FIG. 8 is a seventh schematic structural diagram of a semiconductor structure after an etching step according to some embodiments of the disclosure.

Within the first preset time period, the first conductive material layer 310a is etched by using the second etching gas containing hydrogen bromide and chlorine until the bottom of the groove structure is exposed, referring to FIG. 8.

Figure 9:
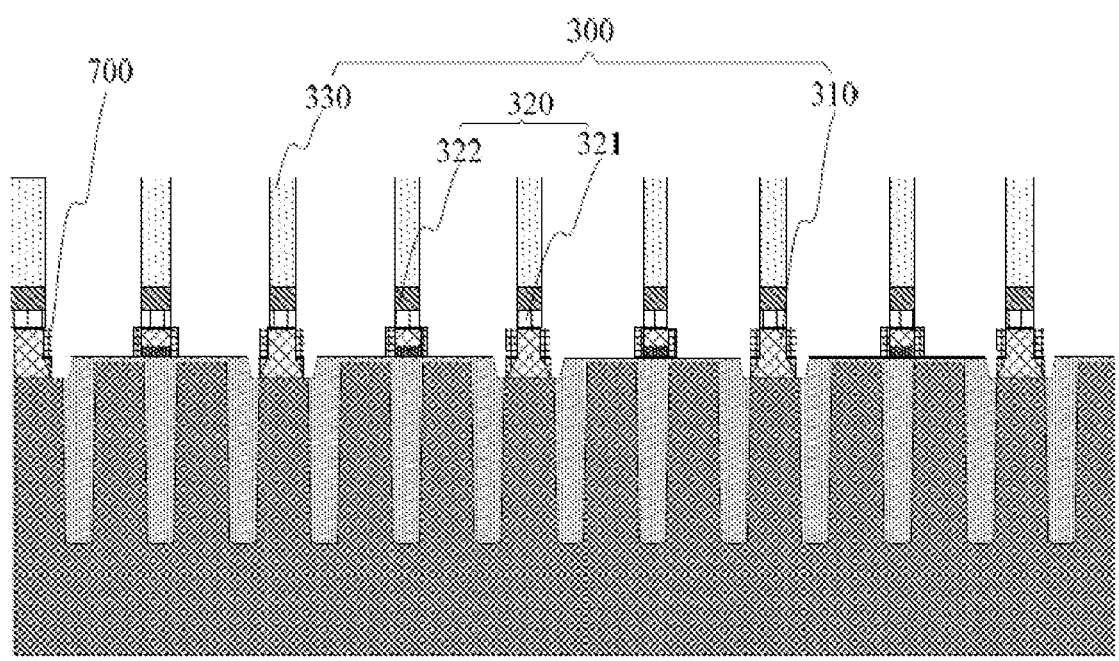
FIG. 9 is an eighth schematic structural diagram of a semiconductor structure after an etching step according to some embodiments of the disclosure.

Within the second preset time period, introducing of the second etching gas is stopped, and oxygen is introduced to oxidize the first conductive material layer, such that an oxide layer 700 is formed on the surface of the first conductive material layer, referring to FIG. 9. The thickness of the oxide layer 700 on the surface of the first conductive material layer in the groove structure 200 is smaller than that of the oxide layer on the surface of the first conductive material layer outside the groove structure 200. The second etching stage including the first preset time period and the second preset time period.

The oxide layer 700 is removed. Specifically, the oxide layer can be removed by weak hydrofluoric acid to obtain the first conductive layer 310 having an inverted funnel-shaped cross-section, referring to FIG. 10.

In the embodiment, in the second etching stage, hydrogen bromide with weak etching ability is used for etching, which guarantees that the shoulders of the active areas are not damaged. Moreover, oxygen is synchronously introduced to oxidize the polysilicon material in the etching process, oxide is formed on the surface of the first conductive material layer 310a, and the oxidization speed of the polysilicon material in the groove structure 200 is smaller than that of the polysilicon material outside the groove structure 200. Therefore, after the etching process is completed, the oxide is removed by weak hydrofluoric acid, and the first conductive material layer 310a having an inverted funnel-shaped cross-section is obtained, which serves as the first conductive layer 310.

In some other embodiments, the step of etching the first conductive material layer in the second etching stage includes the following operations.

The first conductive material layer 310a is etched by using the second etching gas containing hydrogen bromide and chlorine, and oxygen is synchronously introduced to oxidize the first conductive material layer 310a, therefore the first pattern structure 300 is formed in the groove structure 200, the oxide layer 700 is formed on the surface of the first conductive layer of the first pattern structure 300, and the thickness of the oxide layer 700 on the surface of the first conductive material layer in the groove structure is smaller than that of the oxide layer on the surface of the first conductive material layer outside the groove structure.

The oxide layer 700 is removed.

In addition, the processes of etching, oxidizing and removing the oxide layer can be executed for two or more cycles until a desired first pattern structure is formed. Each cycle processes include the following operations. First, hydrogen bromide gas is introduced to etch the first conductive material layer in the second etching stage, and introducing of the hydrogen bromide gas is stopped after etching lasts for 10 seconds. Then, oxygen is introduced to carry out oxidation treatment on the first conductive material layer 310a, and the oxidation treatment lasts for 5 s, such that the oxide layer is formed on the surface of the first conductive material layer 310a. Finally, the oxide layer is removed.

In one of the embodiments, the volume ratio of hydrogen bromide to oxygen is in the range of about (100-500):(10-50). In the embodiment of the disclosure, in the first etching stage, the volume ratio of hydrogen bromide to oxygen in the etching gas is in the range of (100-500):(10-50), therefore the etching speed and the oxidation speed can be ensured to be in a better range.

In one of the embodiments, the second etching gas further includes argon and helium. The flow rate of hydrogen bromide ranges from about 100 SCCM to about 500 SCCM, the flow rate of chlorine ranges from about 15 SCCM to about 35 SCCM, the flow rate of oxygen ranges from about 10 SCCM to about 50 SCCM, the flow rate of argon ranges from about 400 SCCM to about 600 SCCM, and the flow rate of helium ranges from about 300 SCCM to about 500 SCCM.

It can be understood, by controlling each gas within a reasonable range, the etching power of the second etching gas can be reduced, such that damage to the shoulders of the active regions by the second etching gas can be avoided, meanwhile, it is guaranteed that the width of the bottom of the first conductive layer 310 is greater than the width of the top of the first conductive layer 310, and the contact area of the first pattern structure 300 and the active regions is increased. Specifically, the flow rate of chlorine can be 20, 25, or 30 SCCM; the flow rate of oxygen can be 20, 30, or 40 SCCM; the flow rate of argon can be 450, 500, or 550 SCCM; and the flow rate of helium can be 350, 400, or 450 SCCM.

In one of the embodiments, the duration of the second etching stage is about 35-45 s. It can be understood, when the first conductive material layer 310a is etched by using the second etching gas containing hydrogen bromide and chlorine, the etching time needs to be controlled within a reasonable range to prevent the first pattern structure 300 from collapsing as the first pattern structure 300 is too thin due to excessive etching caused by excessively long etching time, and prevent the phenomenon that the bottom of the first conductive material layer 310a is not etched due to insufficient etching time. In another embodiment, the duration of the second etching stage is about 40 s.

Figure 10:
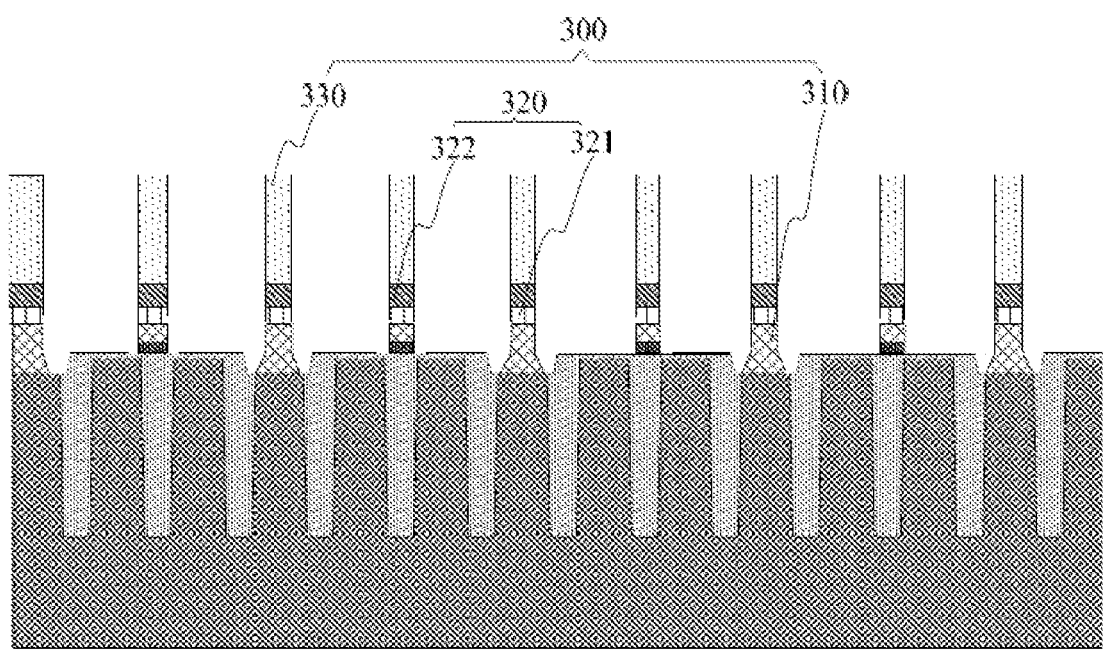
FIG. 10 is a ninth schematic structural diagram of a semiconductor structure after an etching step according to some embodiments of the disclosure.

Embodiments of the disclosure further provide a semiconductor structure, referring to FIG. 10. The semiconductor structure includes a substrate 100 and a first pattern structure 300.

A groove structure 200 is formed in the substrate 100.

The first pattern structure 300 includes a first conductive layer 310, a second conductive layer 320 and an insulating layer 330 which are laminated from bottom up. A part of the first pattern structure 300 is located on the surface of the substrate and other part of the first pattern structure 300 is located on the bottom of the groove structure 200. The width of the bottom of the first pattern structure 300 located in the groove structure 200 is not smaller than the width of the bottom of the first pattern structure 300 located outside the groove structure 200.

In one of the embodiments, the first conductive layer 310 located in the groove structure 200 is in an inverted funnel shape. It can be understood, when the first conductive layer 310 is in an inverted funnel shape, the contact area of the bottom of the first conductive layer 310 and the substrate 100 can be increased, therefore, the contact resistance of the first conductive layer 310 and the substrate 100 is reduced, and meanwhile, the contact area of a node contact window and the substrate is not affected.

In one of the embodiments, the end, proximal to the second conductive layer 320, of the first conductive layer 310 has the same width as the end, proximal to the substrate 100, of the second conductive layer 320, therefore, the first conductive layer 310 has a good supporting effect for the second conductive layer 320.

In one of the embodiments, the semiconductor structure further includes a dielectric layer, and the dielectric layer is located between the upper surface of the substrate and the first conductive layer.

In one of the embodiments, the second conductive layer includes a metal barrier material layer and a metal material layer. The metal barrier material layer is located above the first conductive layer, the metal material layer is located above the metal barrier material layer, and metal in a metal material formed by the metal barrier material layer is diffused into the first conductive layer.

According to embodiments of the disclosure, the first conductive material layer 310a fills the groove structure 200 and covers the surface of the substrate 100. In the process of forming the first pattern structure 300 by etching, the process of etching the first conductive material layer 310a includes the first etching stage and the second etching stage. In the first etching stage, the first etching gas containing chlorine is used for etching the first conductive material layer 310a until the upper surface of the substrate 100 is exposed. As chlorine, a small molecule, is easy to diffuse, the ratio of the longitudinal etching rate to the transverse etching rate can be increased, therefore it is guaranteed that the upper part of the first conductive material layer 310 keeps a good vertical condition, the first conductive layer 310 does not occupy the space of the upper surface of the active regions, and the etching process is accelerated. In the second etching stage, the second etching gas containing hydrogen bromide is used for etching the first conductive material layer 310a, the first conductive material layer 310a is oxidized after or during etching. Since the oxidation rate of the first conductive material layer 310a outside the groove structure 200 is greater than the oxidation rate of the first conductive material layer 310a inside the groove structure 200, after the oxide is etched and washed way, the width of the first conductive material layer 310a in the groove structure 200 is not smaller than the width of the first conductive material layer 310a outside the groove structure, the contact area of the first pattern structure 300 and an active region is increased, the resistance between the first pattern structure and the substrate is reduced, and the quality of the semiconductor structure is improved.

The technical features of the above-described embodiments can be randomly combined, and not all possible combinations of the technical features in the above-described embodiments are described for simplicity of description, however, as long as the combinations of the technical features do not contradict each other, they should be considered to be within the scope of the description of the present specification.

The embodiments described above represent only several implementation modes of the disclosure, and the description thereof is specific and detailed, but should not be construed as limiting the scope of disclosure accordingly. It should be pointed out that those of ordinary skill in the art can also make some modifications and improvements without departing from the concept of the disclosure, and these modifications and improvements all fall within the scope of protection of the disclosure. Accordingly, the scope of the patent of the present application should be subject to the appended claims.

What is claimed is:

1. A method for manufacturing a semiconductor structure, comprising:
    providing a substrate, a groove structure being forming in the substrate;
    forming a laminated structure on the substrate, the laminated structure comprising a first conductive material layer, a second conductive material layer and an insulating material layer from bottom up, wherein the first conductive material layer fills the groove structure and covers a surface of the substrate; and
    etching the insulating material layer, the second conductive material layer and the first conductive material layer sequentially to form an insulating layer, a second conductive layer, and a first conductive layer, respectively, the insulating layer, the second conductive layer and the first conductive layer jointly forming a first pattern structure;
    wherein a process of etching the first conductive material layer comprises a first etching stage and a second etching stage, wherein in the first etching stage, a first etching gas is used for etching the first conductive material layer until an upper surface of the substrate is exposed; and in the second etching stage, a second etching gas is used for etching the first conductive material layer, wherein the second etching stage comprises a first preset time period and a second preset time period, within the first preset time period, etching the first conductive material layer with the second etching gas containing hydrogen bromide and chlorine till a bottom of the groove structure is exposed; within the second preset time period, stopping introducing the second etching gas, and oxygen is introduced to oxidize the first conductive material layer, to form an oxide layer on the surface of the first conductive material layer; wherein a thickness of the oxide layer on the surface of the first conductive material layer in the groove structure is smaller than that of the oxide layer on the surface of the first conductive material layer outside the groove structure; and the oxide layer is removed to form the first pattern structure; and
    wherein, a bottom width of the first pattern structure located in the groove structure is greater than a width of the first pattern structure located outside the groove structure.

2. The method for manufacturing the semiconductor structure of claim 1, wherein said etching the insulating material layer, the second conductive material layer and the first conductive material layer sequentially comprises:
    forming a first hard mask layer on the upper surface of the insulating material layer, wherein the first pattern structure is defined by the first hard mask layer;
    etching the insulating material layer until the second conductive material layer is exposed by using the first hard mask layer as a mask to form the insulating layer;
    removing the first hard mask layer;
    etching the second conductive material layer until the first conductive material layer is exposed by using the insulating layer as a mask, and transferring the first target pattern to the second conductive material layer to form the second conductive layer; and
    etching the first conductive material layer in stages by using the insulating layer as a mask, wherein the upper surface of the substrate is exposed to form the first pattern structure after the first etching stage is finished, and the first pattern structure is formed in the groove structure after the second etching stage is finished.

3. The method for manufacturing the semiconductor structure of claim 1, wherein said etching the first conductive material layer in the second etching stage comprises:
    etching the first conductive material layer with the second etching gas containing hydrogen bromide and chlorine, and synchronously introducing oxygen to oxidize the first conductive material layer, therefore the first pattern structure is formed in the groove structure, the oxide layer is formed on the surface of the first conductive layer of the first pattern structure; wherein, a thickness of the oxide layer on the surface of the first conductive material layer in the groove structure is smaller than that of the oxide layer on the surface of the first conductive material layer outside the groove structure; and
    removing the oxide layer.

4. The method for manufacturing the semiconductor structure of claim 1, wherein a volume ratio of hydrogen bromide to oxygen is in a range of about (100-500):(10-50).

5. The method for manufacturing the semiconductor structure of claim 4, wherein the second etching gas further comprises argon and helium; and
    a flow rate of hydrogen bromide ranges from about 100 SCCM to about 500 SCCM, a flow rate of chlorine ranges from about 15 SCCM to about 35 SCCM, a flow rate of oxygen ranges from about 10 SCCM to about 50 SCCM, a flow rate of argon ranges from about 400 SCCM to about 600 SCCM, and a flow rate of helium ranges from about 300 SCCM to about 500 SCCM.

6. The method for manufacturing the semiconductor structure of claim 5, wherein a duration of the second etching stage is about 35-45 s.

7. The method for manufacturing the semiconductor structure of claim 1, wherein an etching ability of the first etching gas is stronger than that of the second etching gas.

8. The method for manufacturing the semiconductor structure of claim 7, wherein the first etching gas comprises chlorine, nitrogen, argon, and helium; and
   a flow rate of chlorine ranges from about 80 SCCM to about 120 SCCM, a flow rate of nitrogen ranges from about 60 SCCM to about 80 SCCM, a flow rate of argon ranges from about 40 SCCM to about 60 SCCM, and a flow rate of helium ranges from about 300 SCCM to about 500 SCCM.

9. The method for manufacturing the semiconductor structure of claim 8, wherein a duration of the first etching phase is about 12-18 s.

10. The method for manufacturing the semiconductor structure of claim 1, wherein said forming the groove structure in the substrate comprises:
   forming a dielectric layer on the surface of the substrate;
   forming a second hard mask layer on the surface of the dielectric layer, and the groove structure is defined by the second hard mask layer; and
   etching the dielectric layer and the substrate to form the groove structure by using the second hard mask layer as a mask.

11. The method for manufacturing the semiconductor structure of claim 1, wherein the first conductive material layer comprises a polysilicon material layer.

12. The method for manufacturing the semiconductor structure of claim 11, wherein said forming the second conductive material layer comprises:
   forming a metal barrier material layer covering the upper surface of the polysilicon material layer; and
   forming a metal material layer covering the upper surface of the metal barrier material layer, the metal barrier material layer and the metal material layer jointly forming the second conductive material layer.

* * * * *